(12) United States Patent
Beatty et al.

(10) Patent No.: US 10,290,592 B2
(45) Date of Patent: May 14, 2019

(54) SEMICONDUCTOR PACKAGE, AND A METHOD FOR FORMING A SEMICONDUCTOR PACKAGE

(71) Applicant: Intel Corporation, Santa Clara, CA (US)

(72) Inventors: John J Beatty, Chandler, AZ (US); Suzana Prstic, Chandler, AZ (US); Vipul V Mehta, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 26 days.

(21) Appl. No.: 15/638,527

(22) Filed: Jun. 30, 2017

(65) Prior Publication Data
US 2019/0006293 A1    Jan. 3, 2019

(51) Int. Cl.
*H01L 23/00* (2006.01)
*H01L 23/34* (2006.01)

(52) U.S. Cl.
CPC ............ *H01L 23/562* (2013.01); *H01L 23/34* (2013.01); *H01L 24/17* (2013.01); *H01L 24/81* (2013.01); *H01L 2924/3511* (2013.01); *H01L 2924/35121* (2013.01)

(58) Field of Classification Search
CPC ....... H01L 23/562; H01L 24/17; H01L 23/34; H01L 24/81; H01L 2924/35121; H01L 2924/3511
USPC .......................................................... 257/712
See application file for complete search history.

(56) References Cited

U.S. PATENT DOCUMENTS

| | | | |
|---|---|---|---|
| 2007/0145571 A1* | 6/2007 | Lee .................. | H01L 21/563 257/706 |
| 2008/0099910 A1* | 5/2008 | McLellan .......... | H01L 21/563 257/723 |

* cited by examiner

*Primary Examiner* — Fernando L Toledo
*Assistant Examiner* — Adam S Bowen
(74) *Attorney, Agent, or Firm* — 2SPL Patentanwälte PartG mbB; Mani Arabi

(57) ABSTRACT

A semiconductor package includes a semiconductor die arranged on a substrate. The semiconductor package includes a stiffener structure arranged on the substrate. The stiffener structure is spaced at a distance from the semiconductor die. The stiffener structure includes a molding compound material.

24 Claims, 8 Drawing Sheets

SEMICONDUCTOR PACKAGE, AND A METHOD FOR FORMING A SEMICONDUCTOR PACKAGE

TECHNICAL FIELD

Examples relate to concepts for reducing semiconductor package warpage, and in particular to a semiconductor package and a method for forming a semiconductor package.

BACKGROUND

Semiconductor packages may be susceptible to warpage due to mismatches in coefficient for thermal expansion (CTE) of the materials used in different parts of the semiconductor package. Variations in temperature caused by heating processes and/or humidity may cause warpage of the semiconductor package to occur. Warpage may lead to die cracking, delamination, and/or solder shorts occurring in the semiconductor package.

BRIEF DESCRIPTION OF THE FIGURES

Some examples of apparatuses and/or methods will be described in the following by way of example only, and with reference to the accompanying figures, in which.

DETAILED DESCRIPTION

Figure 1A:
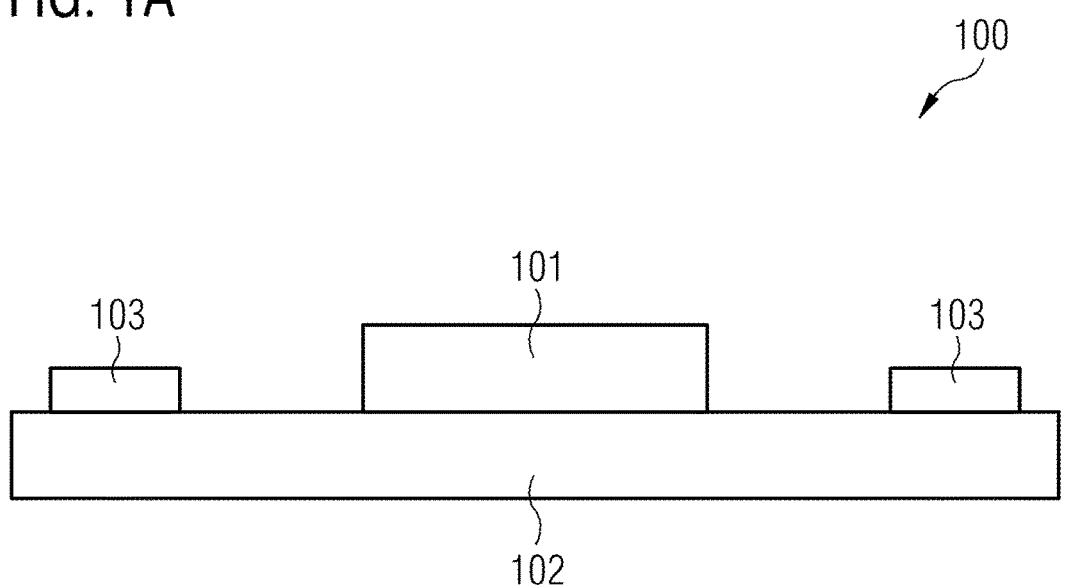
FIG. 1A shows a schematic illustration of a side view of a semiconductor package.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Electrical components or devices may be embedded in packages to provide protection against impact and corrosion, to hold the contact pins or leads and/or to dissipate heat produced by the device, for example. A semiconductor package may include one or more semiconductor components. Individual components may be formed in a silicon wafer before being cut and assembled in a package. A semiconductor package may have only few leads or contacts for devices such as diodes, or may have hundreds of contact interfaces (e.g. pads, solder balls or solder bumps) in case of a microprocessor, for example. In addition to providing connections to the semiconductor die and handling waste heat, the semiconductor package may protect the semiconductor die against the ingress of moisture, for example. Similarly, non-semiconductor electrical components (e.g. resistors, capacitors, inductors) may be arranged in packages.

FIG. 1A shows a schematic illustration of a side cross-sectional view of a semiconductor package 100.

The semiconductor package 100 comprises a semiconductor die 101 arranged on a substrate 102 (e.g. package substrate). The semiconductor package 100 further comprises a stiffener structure 103 arranged on the substrate 102. The stiffener structure 103 (e.g. package stiffener structure) is spaced at a distance from the semiconductor die 101, and the stiffener structure 103 comprises a molding compound material.

Due to the stiffener structure 103 comprising the molding compound (or mold compound) material, the stiffener structure 103 may be modified more easily to reach a desired state compared to a stiffener structure including (or consisting of) other materials. Additionally, it may be possible that the overall size of the semiconductor package 100 be reduced, since a separation distance (e.g. a keep out zone KOZ) between the stiffener structure 103 and the semiconductor die 101 do not need to be as large as compared to metal package stiffeners or integrated heat spreader (IHS) lids. Additionally, the stiffener structure 103 comprising the molding compound material may be allowed to cover die side components, which may lead to more efficient space sharing that may otherwise be lost when using metal package stiffeners or IHS lids which need to be kept separate from the die side components. This may lead to cost and/or power delivery improvements, as die side components may be brought closer to the semiconductor die 101.

The stiffener structure 103 may be configured to reduce a warpage (e.g. bending, or deformation) of the semiconductor package 100. For example, the stiffener structure 103 may be a structure which mechanically strengthens the semiconductor package 100 and reduces warpage of the semiconductor package 100. Warpage of the semiconductor package 100 may occur due to a mismatch (or differences) in coefficient for thermal expansion (CTE) of the substrate 102 (e.g. a package substrate) and the semiconductor die 101, temperature variations and/or humidity variations. Thus, warpage of the semiconductor package 100 may occur due to different temperature or heating processes being applied to the package (e.g. due to the semiconductor package 100 being heated up and/or cooling down). The stiffener structure 103 may reduce or prevent issues such as die cracking, delamination, and/or solder shorts from occurring by preventing and/or reducing warpage of the semiconductor package 100.

The stiffener structure 103 comprising (or including) the molding compound (MC) material may be referred to as a MC stiffener structure 103 (or Mold stiffener). Optionally, more than 80% (or e.g. more than 90%, or e.g. more than 95%) of the weight content of the stiffener structure 103 may be molding compound material. Optionally, the stiffener structure 103 may consist solely of the molding compound material. The molding compound may include at least one material from the following group of materials: an epoxy resin material, a mold release material, a filler material and a thermoset material, for example. Optionally, the filer material may include non-polymer based filler particles such as silica particles and/or alumina particles, for example. Optionally or additionally the molding compound may include a meltable epoxy resin material, a non-melting inorganic filler material, a catalyst material (for accelerating a curing process), and a mold release material (for releasing or freeing the epoxy resin from the mold). Additionally or optionally, the molding compound may further include a colorant. Additionally or optionally, the stiffener structure 103 may be an electrically insulating stiffener structure. For example, the molding compound material may be an electrically insulating material.

The molding compound material of the stiffener structure 103 may be a stiff material and may act directly on the package to reduce the dynamic warpage when under thermal cycles. Because of the high modulus and mold application method, the semiconductor package may be constrained to a desired shape (reduced warpage) by the stiff material. The stiffener structure 103 may have a young's modulus which is larger than 10 GPa (or e.g. larger than 15 GPa, or e.g. larger than 20 GPa, or e.g. between 10 GPa and 50 GPa depending on filler loading), for example.

The stiffener structure 103 may be arranged on a first lateral surface of the substrate 102. The stiffener structure 103 may be spaced apart laterally at a distance from the semiconductor die 101 which may also be arranged on the first lateral surface of the substrate 102. The semiconductor die 101 may be free from the stiffener structure 103. For example, all portions of the stiffener structure 103 may be spaced laterally apart from the semiconductor die 101 so that the stiffener structure 103 does not touch and/or does not contact the semiconductor die 101 directly. There may be an air gap between (all portions of) the semiconductor die 101 and (all portions of) the stiffener structure 103. The stiffener structure 103 may be arranged laterally around the semiconductor die 101 at a separation distance from vertical edges of the semiconductor die 101. Optionally or additionally, the stiffener structure 103 may be ring-shaped, thus forming a concentric ring (e.g. a circular ring or a rectangular ring) around the semiconductor die 101. Thus, it may be that a first portion of the stiffener structure 103 is arranged at a lateral separation distance from a first edge of the semiconductor die 101, and a second portion of the stiffener structure 103 is arranged at a lateral separation distance from a second opposite edge of the semiconductor die 101 (as can be seen in the side cross-sectional view illustration of FIG. 1A). Alternatively or optionally, the stiffener structure 103 may be L-shaped. The semiconductor package 100 may include one or more portions of stiffener structure 103, each arranged at a separation distance from the semiconductor die 101. For example, the stiffener structure (which may be arranged around the semiconductor die) may be a continuous ring fully extending around the semiconductor die (e.g. to enable a sealed cavity for the semiconductor die) or may include one or more gaps between portions of the stiffener structure. The gaps may aid outgassing, for example. The stiffener structure 103 and the semiconductor die 101 do not overlap in a top view of the semiconductor package, for example.

Optionally, an average lateral distance between the semiconductor die 101 and the stiffener structure 103 at the first surface of the substrate 102 may be between 5% and 95%, (or e.g. less than 80%, or e.g. less than 70%, or e.g. less than 60%, or e.g. between 10% and 80%, or e.g. between 10% and 60%, or e.g. between 10% and 40%) of a maximal (largest) length of the semiconductor die 101. The maximal length of the semiconductor die 101 may be the largest length of an edge of the semiconductor die 101. For example, the average lateral distance between the semiconductor die 101 and the stiffener structure 103 at the first surface of the substrate 102 may be larger than 10 μm and smaller than 20 mm (or e.g. larger than 50 μm and smaller than 10 mm, or e.g. or e.g. larger than 100 μm and smaller than 5 mm).

The stiffener structure 103 may be formed (or arranged) directly on the substrate 102. For example, the molding compound material of the stiffener structure 103 may be dispensed (or e.g. deposited, or e.g. formed) by at least one (e.g. one, or two) of these dispensing processes: injection molding, transfer molding, compression molding. The dispensing processes may dispense (or deposit) the molding compound material directly onto the first surface of the substrate 102. Optionally or additionally, no additional adhesive materials (stiffener adhesives) and/or sealant material are arranged between the stiffener structure 103 and the substrate 102 to glue the stiffener structure 103 to the substrate 102. Thus, the stiffener structure 103 may directly contact the first surface of the substrate 102.

The stiffener structure 103 may cover (or may be formed on, or may be in contact with) less than 70% (or e.g. less than 60%, or e.g. less than 50%, or e.g. less than 40% or e.g. less than 30%, or e.g. less than 20%) of a total lateral area of the first surface of the substrate 102 on which the semiconductor die is disposed (e.g. in a top view of the semiconductor package 100). Additionally, optionally or alternatively, a total lateral area of the stiffener structure 103 in a top view of the semiconductor package 100 may be less than 70% (or e.g. less than 60%, or e.g. less than 50%, or e.g. less than 40%, or e.g. less than 30%, or e.g. less than 20%) of a total lateral area of the first surface of the substrate 102 in a top view of the semiconductor package 100. Additionally or optionally, a maximal lateral width of the stiffener structure 103 may be smaller than the maximal length of the semiconductor die 101. For example, the maximal lateral width of the stiffener structure 103 may be less than 90% (or e.g. less than 60%, or e.g. less than 40%) of the maximal length of the semiconductor die 101. For example, a maximal lateral width (in a first lateral direction) of the stiffener structure 103 may be between 100 μm and 5 mm (or e.g. between 1 mm and 5 mm, or e.g. between 2 mm and 5 mm). A maximal lateral length (in a second lateral direction perpendicular to the first lateral direction) of the stiffener structure 103 may be between 1 mm and 10 mm (or e.g. between 1 mm and 8 mm, or e.g. between 1 mm and 5 mm).

Additionally or optionally, a maximal vertical thickness (vertical dimension) of the stiffener structure 103 may be (but is not necessarily limited to being) less than 3 times (or e.g. less than 2 times, or e.g. less than 1.5 times, or e.g. less than, or e.g. less than 0.8 times, or e.g. less than 0.5 times) a maximal thickness of the semiconductor die 101. The maximal thickness of the semiconductor die 101 may be the largest height or thickness of the semiconductor die 101, for example. For example, a maximal vertical thickness (vertical dimension) of the stiffener structure 103 may be between 100 μm and 5 mm (or e.g. between 1 mm and 5 mm, or e.g. between 2 mm and 5 mm).

The substrate 102 may be a carrier substrate, which may include (or consist of) a ceramic material or a laminate material. The semiconductor die 101 may be electrically connected to the substrate 102 via a plurality of solder structures located at a first lateral surface of the semiconductor die 101. The plurality of solder structures may provide (or may form) a controlled collapse chip connection C4 (e.g. a flip chip connection) between the semiconductor die 101 and the substrate 102. For example, the solder structures may be solder bumps (e.g. controlled collapse chip connection C4 bumps). The semiconductor package 100 may further include an electrically insulating underfill material arranged between the semiconductor die 101 and the substrate 102. Additionally, the underfill material may be arranged laterally between the solder structures of the array of solder structures. For example, the underfill material may fill the gaps between the plurality of solder bumps. The underfill material may provide an enhanced mechanical adhesion between the semiconductor die and the substrate 102. Furthermore, the underfill material may mitigate the effects of stress due to coefficient of thermal expansion mismatch (or differences) between the semiconductor die 101 and the substrate 102.

The substrate 102 may further include a solder grid array (e.g. a solder ball grid array BGA, or e.g. a solder pin grid array PGA, or e.g. a land grid array LGA) arranged on an opposite surface of the substrate 102 from the semiconductor die 101 (e.g. on the second lateral surface of the substrate 102). The solder grid array may include a plurality of solder structures (e.g. solder balls). Additionally, the substrate 102 may include a plurality of electrically conductive through-package vias (e.g. electrically conductive redistribution lines) extending from the first surface of the substrate 102 to the second surface of the substrate 102. The plurality of through-package vias may provide an electrically connection between the solder structures (e.g. solder bumps) at the first surface of the substrate 102 and the solder structures (e.g. solder balls) at the second surface of the substrate 102. For example, a respective solder bump at the first surface of the substrate 102 may be electrically connected to a respective solder ball at the second surface of the substrate 102 by a through package via. The semiconductor package 100 may be connected to a carrier structure (e.g. to a printed circuit board PCB) via the solder grid array. For example, the semiconductor package 100 may be soldered to the carrier structure via the solder grid array. The carrier structure may be an external carrier structure which is not part of the semiconductor package 100, or alternatively, the carrier structure may be a part of the semiconductor package 100.

Additionally or optionally, the semiconductor package 100 may further include at least one die side component (e.g. one or more, or e.g. a plurality) arranged on the first surface of the substrate 102. The die side components may be die side capacitors, die side resistors and/or die side inductors, for example. Optionally, at least one die side component may be located laterally between the stiffener structure 103 and the semiconductor die 101. The at least one die side component may be spaced apart from the semiconductor die by a lateral separation distance. Optionally, the stiffener structure 103 may cover at least part of (or all of) the die side component. For example, the stiffener structure 103 may encapsulate the at least one die side component. It may be possible that the stiffener structure 103 covers all the die side components located at the first surface of the substrate. Alternatively, a first group of die side components of the plurality of die side components may be at least partially covered by the stiffener structure 103 and a second group of die side components of the plurality of die side components may be free from (e.g. uncovered by) the stiffener structure 103. Alternatively, all the die side components may be free from stiffener structure 103. For example, each die side component may be spaced apart from the semiconductor die by a first lateral separation distance and from the stiffener structure 103 by a second lateral separation distance.

Additionally or optionally, the semiconductor package 100 may further include a heat spreader structure thermally contacting the semiconductor die 101. For example, a first portion of the heat spreader structure may be thermally connected to a second opposite lateral surface of the semiconductor die 101 via a thermal interface material (TIM). The thermal interface material may include at least one material from the following group of materials: a polymer-based material, a solder-based material (e.g. STIM), a metal-based material (e.g. mTIM), a silicon-based material, and an epoxy-based material. For example, the TIM material may be a thermal grease, a thermal glue, and/or a thermal adhesive. The TIM material may have a thermal impedance of less than 1 K cm$^2$/W. The heat spreader structure may be arranged on the second lateral surface of the semiconductor die 101. The heat spreader structure may be an integrated heat spreader (IHS) lid with or without vertical extensions (or feet) extending towards (or to) the substrate 102. Optionally, the heat spreader structure may be a flat structure (e.g. have flat lateral surfaces) without protrusions. A portion of the heat spreader structure may be connected to the substrate 102 via the stiffener structure 103. The stiffener structure 103 may be a pillar structure supporting the heat spreader structure. For example, at least part of the stiffener structure 103 may be arranged vertically between the heat spreader structure and the substrate 102.

The semiconductor package 100 may further include a sealing material (sealant) arranged vertically between (or e.g. directly connecting) the heat spreader structure and the stiffener structure 103. The sealing material may include at least one material from the following group of materials: a polymer-based material, a silicon-based material, and an epoxy-based material. Optionally or additionally, a maximal (or largest) lateral width of the sealing material may be less than 80% (or e.g. less than 70%, or e.g. less than 50%) of a maximal (or largest) lateral width of the stiffener structure 103. Alternatively or optionally, the lateral width of some portions of the sealing material may be less than 80% of the maximal lateral width of the stiffener structure 103, and a lateral width of other portions of the sealing material may be equal to (or lie within +/−10%) of the maximal lateral width of the stiffener structure 103.

Optionally, the semiconductor package 100 may be a bare die semiconductor package. For example, no other encapsulation material (and/or molding compound material) covers (and/or encapsulates) the semiconductor die 101 and the stiffener structure 103. For example, the stiffener structure 103 and the semiconductor die 101 may be free from encapsulation material that would cover the stiffener structure 103 and the semiconductor die 101. Alternatively or optionally, the semiconductor die, the die side components and the stiffener structure 103 may be partially or fully surrounded by a package encapsulation material. The package encapsulation material may be an epoxy, a plastic and/or a molding compound, for example. The semiconductor package 100 may have a lateral dimension of greater than 2 cm (or e.g. greater than 5 cm, or, e.g. greater than 10 cm). For example, the semiconductor package 100 may have lateral dimensions of 10 cm×14 cm, for example.

A lateral surface of the semiconductor die 101 may be a substantially even plane (e.g. neglecting unevenness of the semiconductor structure due to the manufacturing process and trenches). For example, a minimal lateral length of the semiconductor die 101, or a minimal dimension of the lateral surface of the semiconductor die 101 may be more than 100 times larger (or more than 1000 times or more than 10000 times) than a maximal height of structures on the main surface. Additionally, a minimal lateral dimension of the lateral surface of the semiconductor die 101 may be more than 100 times larger (or more than 1000 times or more than 10000 times) than a basically vertical dimension (or height) of a vertical edge of the semiconductor die 101. The vertical edges of the semiconductor die 101 may be the edges resulting from individualizing or dicing the semiconductor die 101. The lateral surface may be substantially perpendicular (or orthogonal) to the vertical edges of the semiconductor die 101 (ignoring manufacturing tolerances). For example, in comparison to a (substantially vertical or orthogonal) edge of the semiconductor die 101, the lateral surface may be a basically horizontal surface extending laterally.

Similarly, the lateral surface of the substrate 102 may be a substantially even plane. Additionally, a minimal lateral dimension of the lateral surface of the substrate 102 may be more than 100 times larger (or more than 1000 times or more than 10000 times) than a basically vertical dimension (or height) of a vertical edge of the substrate 102. The lateral surface of the substrate 102 may be substantially perpendicular (or orthogonal) to the vertical edges of the substrate 102. After arranging the semiconductor die 101 on the lateral surface of the substrate 102, the lateral surfaces of the semiconductor die 101 may be substantially parallel to the lateral surfaces of the substrate 102. A lateral dimension, lateral distance or lateral length of the semiconductor die 101 and the substrate 102 may be a dimension or distance measured in a direction substantially horizontal to (and/or parallel to) the lateral surface of the semiconductor die 101 and/or the substrate 102. Additionally, a lateral direction may be a direction substantially horizontal to (and/or parallel to) the lateral surface of the semiconductor die 101 and/or the substrate 102. The total lateral area of the substrate 102 may be the whole (or entire) lateral area of a (e.g. one) lateral surface of the substrate 102 in a top view of the semiconductor package. A vertical dimension, vertical distance or vertical length of the semiconductor die 101 and the substrate 102 may be a dimension or distance measured in a direction substantially perpendicular to the lateral surface of the semiconductor die 101 and/or the substrate 102.

The semiconductor die may be a silicon-based semiconductor die (e.g. having a silicon substrate) or a silicon carbide (SiC)-based semiconductor die. Alternatively, or optionally, the semiconductor die may be a gallium arsenide (GaAs)-based semiconductor die, or a gallium nitride (GaN)-based semiconductor die.

Figure 1B:
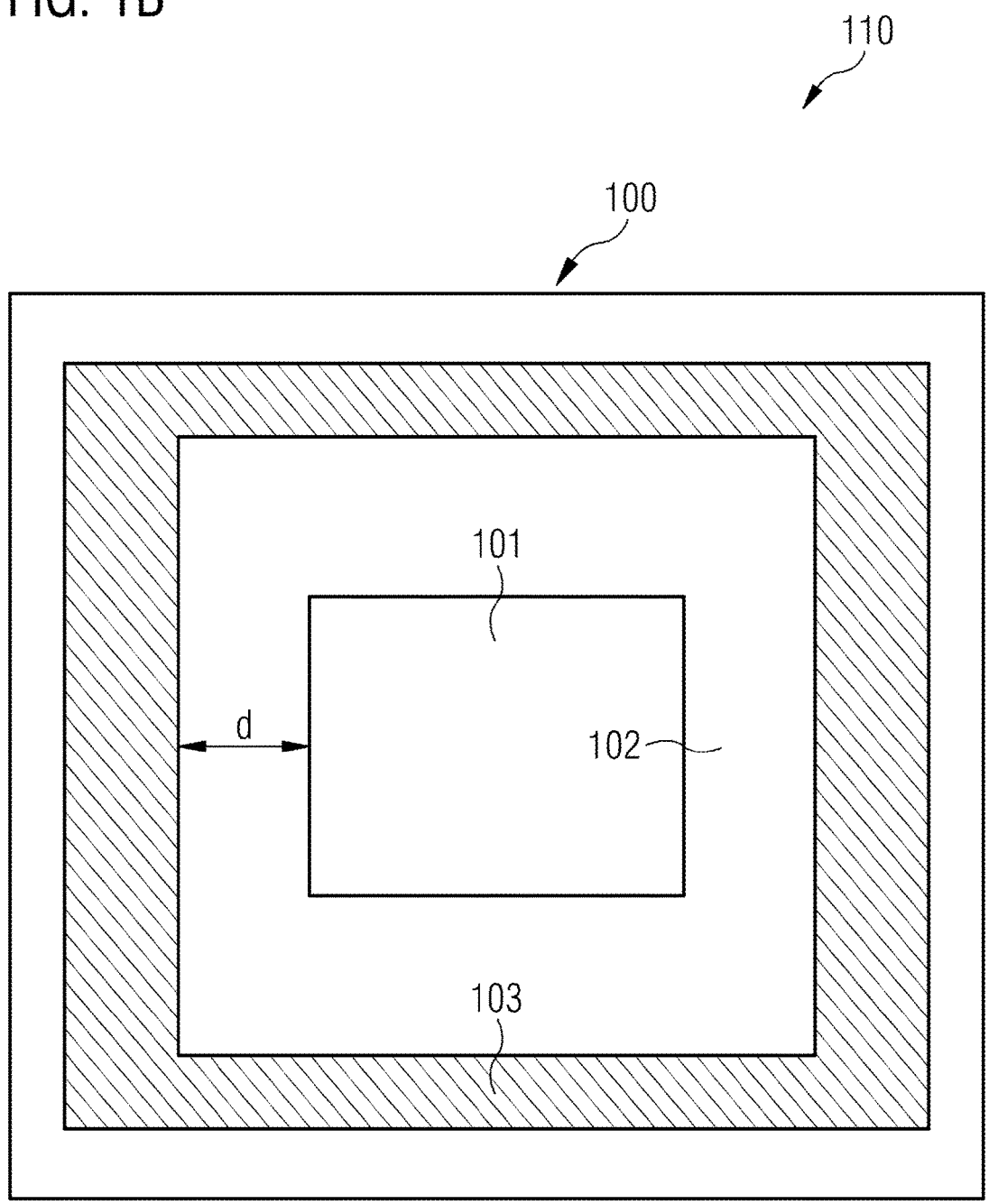
FIGS. 1B to 1C show schematic illustrations of a top view of different semiconductor packages.
Figure 1C:
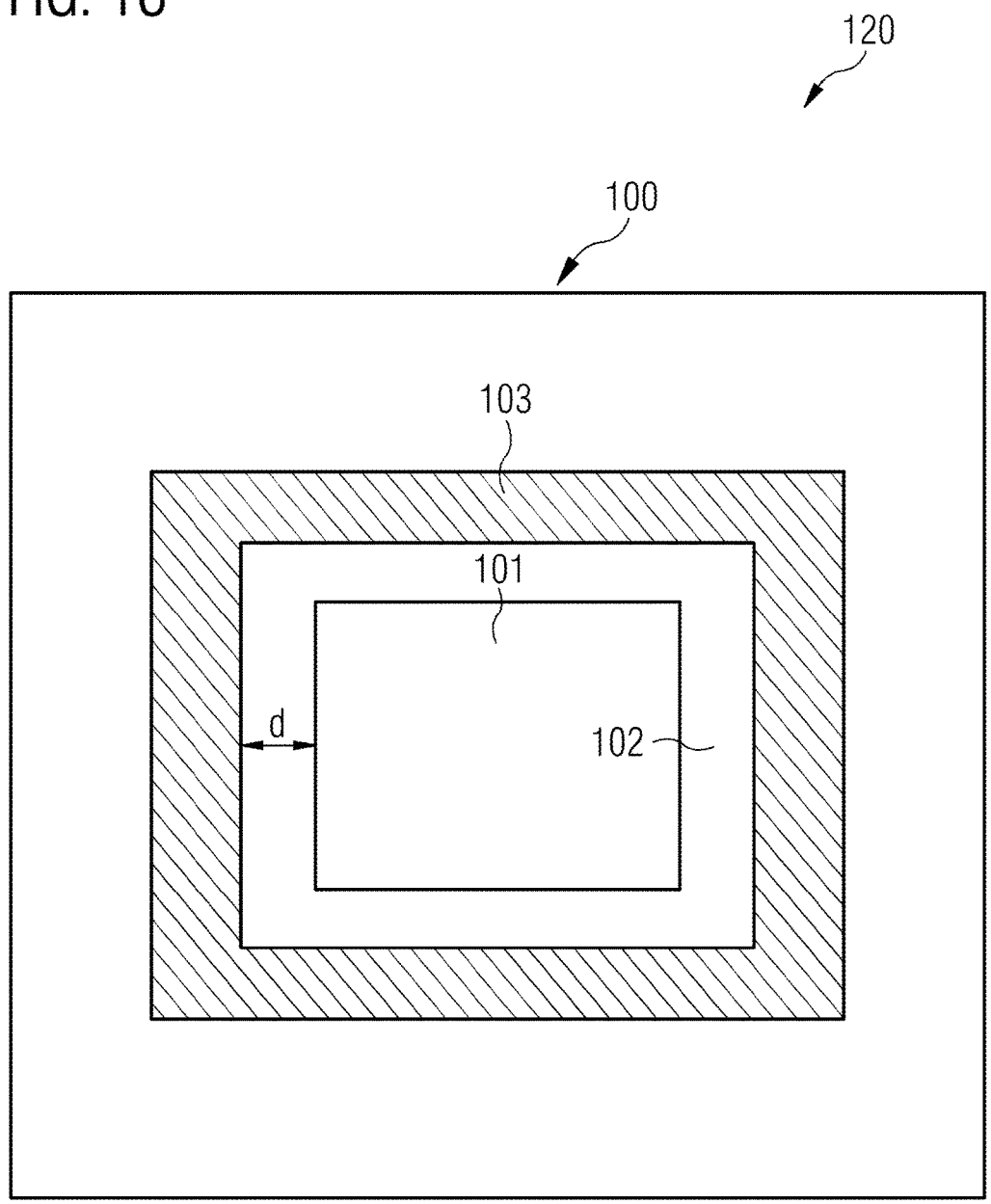

FIGS. 1B and 1C show schematic illustrations 110, 120 of a top view of the semiconductor package 100.

As shown in FIGS. 1B and 1C, the stiffener structure 103 may form a rectangular ring around the semiconductor die 101. For example, the stiffener structure 103 may be arranged around the semiconductor die 101 at a lateral separation distance, d, from edges of the semiconductor die 101. As shown in FIGS. 1B and 1C, using a mold-compound stiffener structure 103 allows the lateral separation distance, d, to be adjusted easily compared to an IHS footprint. Thus, the lateral separation distance, d, may be increased (as shown in FIG. 1B) or reduced (as shown in FIG. 1C) as required. The MC stiffener structure 103 may be implemented with or without an IHS.

The examples described herein relate to forming or arranging a stiffener by using mold on the package either after die attach and underfill, or prior to die attach to control incoming package warpage. The stiffener may be controlled for height, width and X,Y (e.g. lateral) coverage based on warpage requirements, thermal requirements or any combination of mechanical or thermal requirements. This control may be managed through the mold chase design and may be intrinsically changeable because of this.

The examples described herein further relate to controlling semiconductor package warpage using the stiff mold (e.g. molding compound) material. The warpage control may improve thermal performance, surface mount technology (SMT) for ball grid arrays (BGA), and/or may improve die, bump and underfill (UF) reliability. Additionally this type of stiffener structure 103 may be used as a module stiffening device that may provide additional flexibility to the assembly flow when an integrated heat spreader (IHS) is needed, for example. The use of MC stiffener structures 103 may further potentially reduce effective assembly keep out zone (KOZ) requirements for IHS attach. The various examples may allow the MC stiffener structure 103 to be modified and dialed in to reach a desired state, compared to a metal or pre-attached stiffener.

Additionally, the molded stiffener may take up less package surface area than a metal stiffener or IHS lid, which may both require an open region on the package (KOZ) free of die side components (DSCs) to land. The MC package stiffener 103 may be designed such that it covers those components, effectively sharing space that may otherwise be lost under the IHS or metal stiffener. This may lead to cost and power delivery benefits as DSCs may be brought closer to the die in some cases, thus increasing the efficiency and reducing the number of DSCs needed as well as reducing package size.

The various examples also relate to adding the MC stiffener structure 103 to semiconductor packages that may be suffering from high warpage and/or high dynamic warpage. Unlike metal stiffeners or an IHS lid which require strict keep out zones (KOZ) and may limit the topside space available for die and DSCs, the MC stiffener structure 103 may be designed such that it re-uses space allocated for DSCs and in the case of thermals may be designed such that it minimizes the stress on the PTIM when needed by reducing the overhang or increasing the sealant to lid coupling.

The MC stiffener structure may be coupled with IHS attach or other technologies. Furthermore, the MC stiffener structure does not suffer from the intrinsic issue of signal disruption of metal stiffeners which then need to be grounded. The MC stiffener structure may replace metal stiffeners, and/or may replace the IHS foot prior to IHS attach to reduce incoming warpage and use a flat IHS at lid attach. In the case of a semiconductor package with an IHS, the adjustability of the MC stiffener structure may allow the die to IHS coupling overhang to be modulated as part of the design and process. They need not be limited by the top-side components or die locations and shapes. This flexibility may manifest itself in the products thermal performance, for example, such as on high warpage packages like MCP and Server products. The thermal performance gain may further extend to Rel cycles where the stiffer package and reduced dynamic warpage may reduce Rel degradation due to temperature cycling, one of the primary failure modes for polymer thermal interface materials. By implementing a molding compound material and IHS, thermal performance gains may be incurred on high warpage packages that result in high degradation during REL or even at TO. The flexibility of using a mold based stiffener may even result in a quicker manufacturing time, and provide better customizability.

Instead of high warpage, the semiconductor package 100 may have reduction in warpage either for chip attach, BA & surface mount technology (SMT) and/or thermal performance. The semiconductor package 100 may be a larger server type packages or complex multi-chip packages (MCP) with non-typical warpage, for example.

Figure 2:
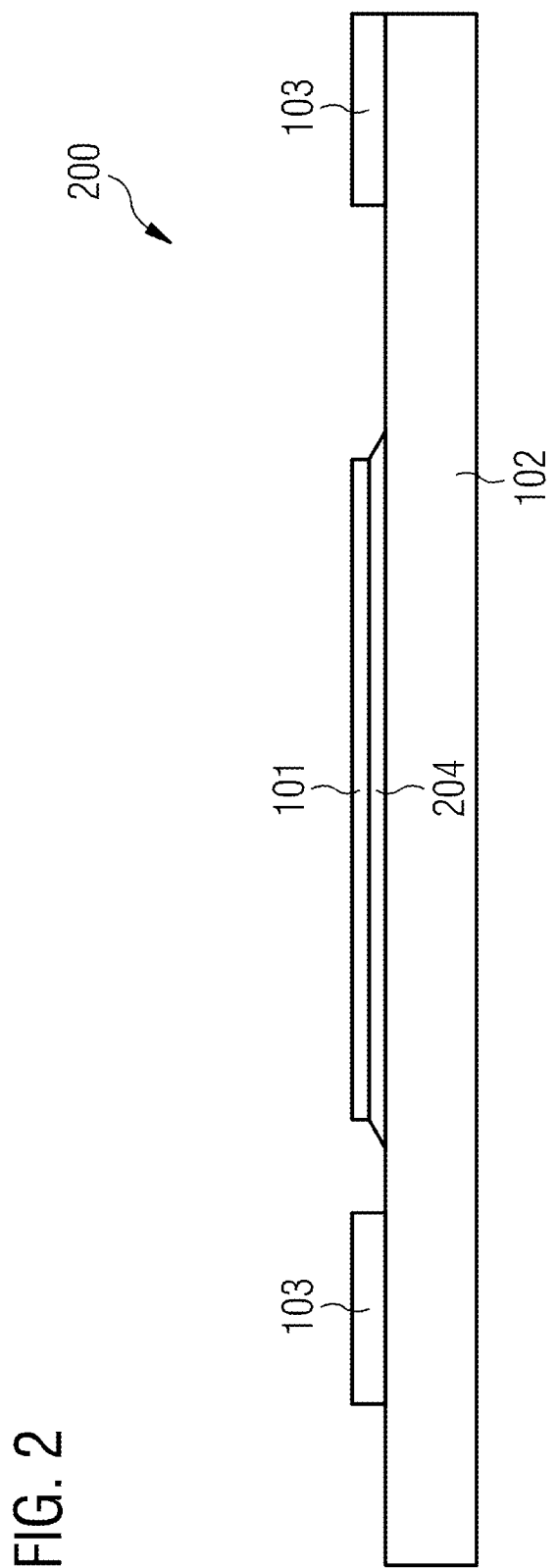
FIG. 2 shows a schematic illustration of a side view of a semiconductor package with an underfill material.

FIG. 2 shows a schematic illustration of a side cross-sectional view of a semiconductor package 200.

The semiconductor package 200 may be similar to the semiconductor package 100. For example, the semiconductor package 200 may include one or more or all of the features of the semiconductor package 200.

The semiconductor package 200 may be a bare die semiconductor package. For example, no other encapsulation material (and/or molding compound material) covers (and/or encapsulates) the semiconductor die 101 and the stiffener structure 103. The semiconductor package 200 may further include the electrically insulating underfill material 204 arranged (or formed) between the semiconductor die 101 and the substrate 102. Additionally, the underfill material may be arranged laterally between the solder structures of the array of solder structures (not shown).

More details and aspects are mentioned in connection with the examples described above or below. The examples shown in FIG. 2 may comprise one or more optional additional features corresponding to one or more aspects mentioned in connection with the proposed concept or one or more examples described above (e.g. FIGS. 1A to 1C) or below (FIGS. 3 to 6).

Figure 3:
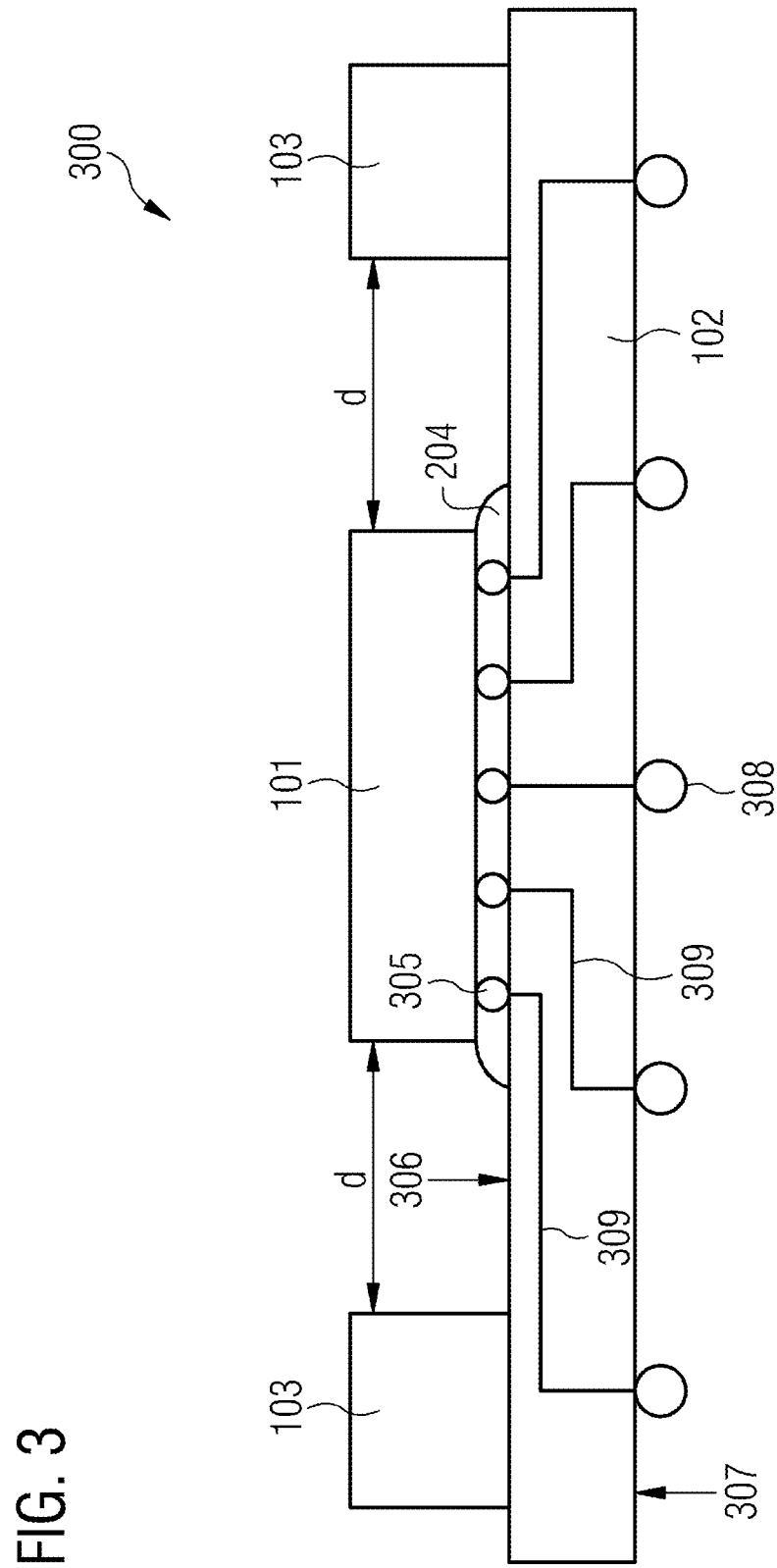
FIG. 3 shows a schematic illustration of a side view of a semiconductor package with solder structures.

FIG. 3 shows a schematic illustration of a side cross-sectional view of a semiconductor package 300.

The semiconductor package 300 may be similar to the semiconductor package 200. For example, the semiconductor package 300 may include one or more or all of the features of the semiconductor package 200.

As shown in FIG. 3, the stiffener structure 103 and the semiconductor die 101 may be arranged on the first surface 306 of the substrate 102. The stiffener structure 103 may be may be spaced laterally at a distance, d, from the semiconductor die 101. The underfill material 204 may fill the gaps between the plurality of solder bumps 305 arranged between the semiconductor die 101 and the substrate 102. The substrate 102 may further include a solder grid array (e.g. a solder ball grid array) or solder structures 308 arranged on the second surface 307 of the substrate 102. The substrate 102 may include a plurality of electrically conductive through-package vias 309 extending from the first surface of the substrate 102 to the second surface of the substrate 102. For example, each through package via 309 may connect a solder bump 305 at the first surface 306 of the substrate 102 to a solder ball 308 at the second surface 307 of the substrate 102.

Figure 5:
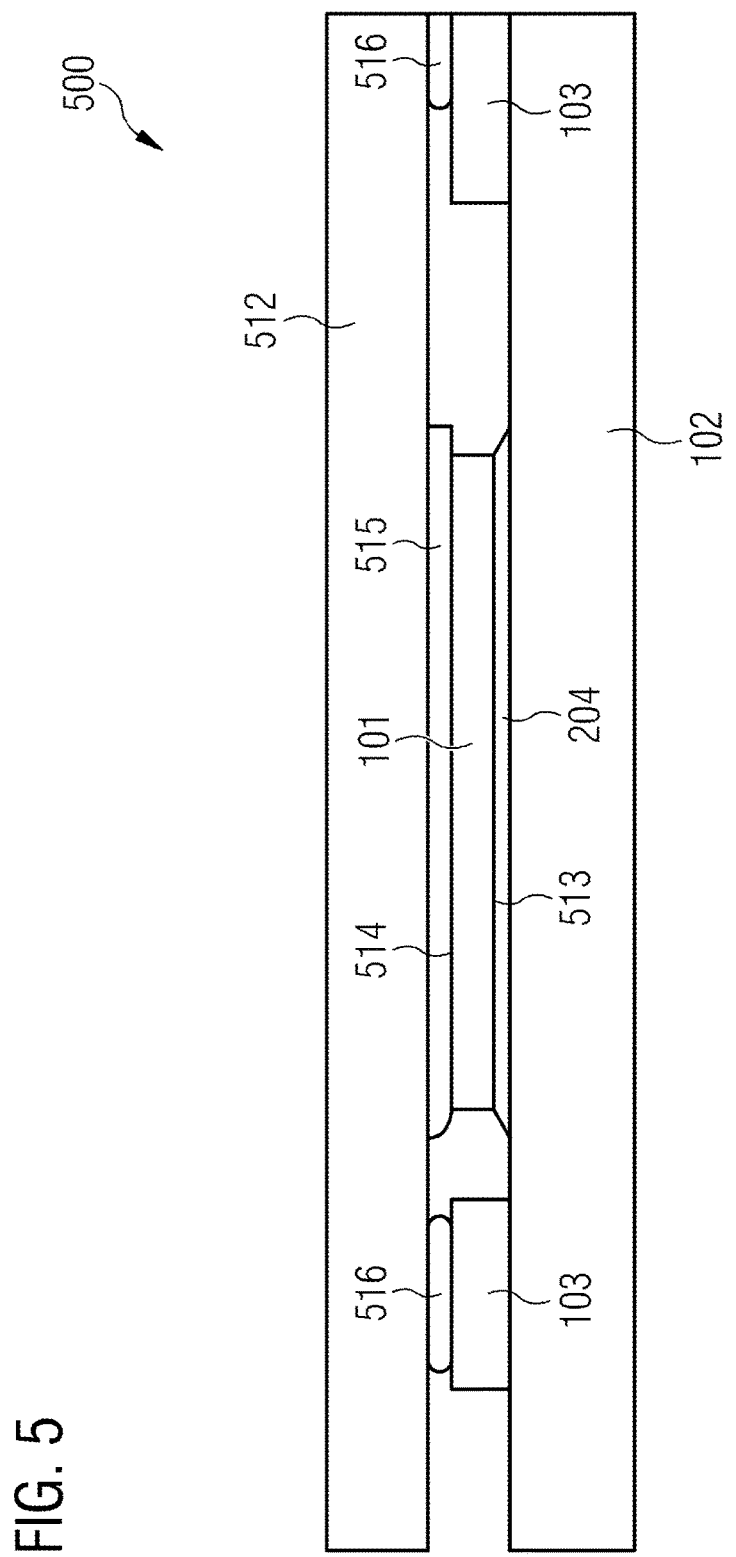
FIG. 5 shows a schematic illustration of a side view of a semiconductor package with a heat spreader structure.
Figure 6:
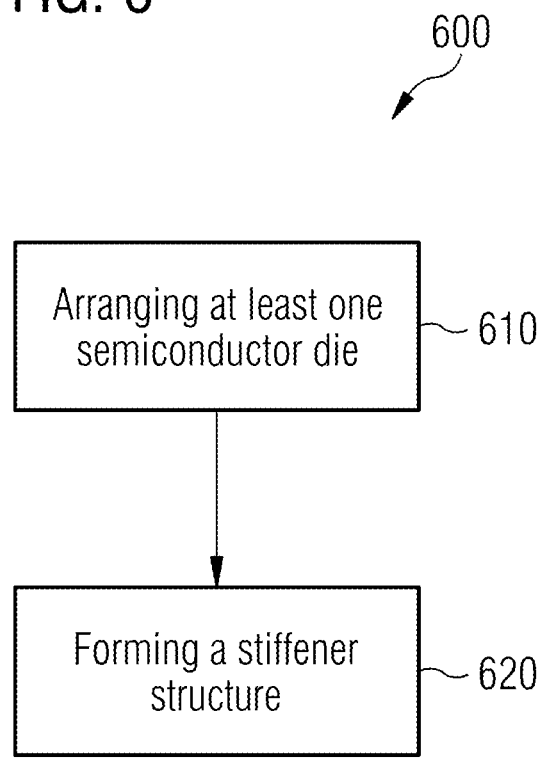
FIG. 6 shows a flow chart of a method for forming a semiconductor package.

More details and aspects are mentioned in connection with the examples described above or below. The examples shown in FIG. 3 may comprise one or more optional additional features corresponding to one or more aspects mentioned in connection with the proposed concept or one or more examples described above (e.g. FIGS. 1A to 2) or below (FIGS. 4 to 6).

Figure 4:
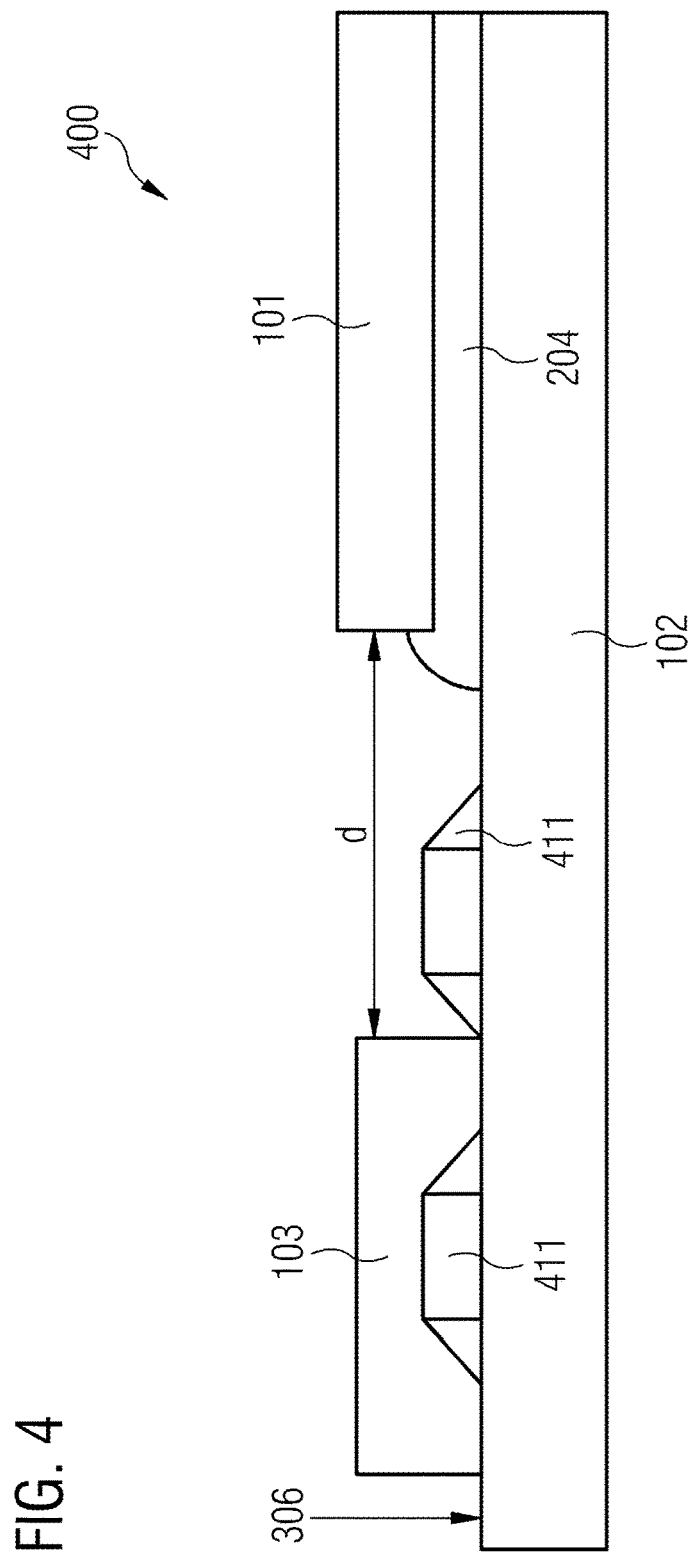
FIG. 4 shows a schematic illustration of a side view of a semiconductor package with at least one die side component.

FIG. 4 shows a schematic illustration of a side cross-sectional view of a semiconductor package 400.

The semiconductor package 400 may be similar to the semiconductor package 300. For example, the semiconductor package 400 may include one or more or all of the features of the semiconductor package 300.

As shown in FIG. 4, the semiconductor package 400 may further include at least one die side component 411 (e.g. one or more, or e.g. a plurality) arranged on the first surface 306 of the substrate 102. The die side components 411 may be spaced apart from the semiconductor die by a lateral separation distance. For example, the semiconductor package 400 may include several die side components 411, which may be each be spaced apart from the semiconductor die at different separation distances. The stiffener structure 103 may cover at least part of (or all of) at least one die side component. Thus, the die side component may be in the mold stiffener area. For example, the stiffener structure 103 may encapsulate at least one die side component 411. It may be possible that some die side components (e.g. at least one) 411 of the plurality of die side components 411 may be free from (e.g. uncovered) by the stiffener structure 103. As shown in FIG. 4, a first die side component 411 may be encapsulated by the stiffener structure 103, and a second die side component 411 located laterally between the first die side component 411 and the semiconductor die 101 may be free from (e.g. uncovered, e.g. not covered by) the stiffener structure 103. Optionally, it may be possible that the stiffener structure 103 covers all the die side components 411 located at the first surface 306 of the substrate 102. Alternatively, it may be possible that the stiffener structure 103 covers none of the die side components 411 located at the first surface 306 of the substrate 102.

More details and aspects are mentioned in connection with the examples described above or below. The examples shown in FIG. 4 may comprise one or more optional additional features corresponding to one or more aspects mentioned in connection with the proposed concept or one or more examples described above (e.g. FIGS. 1A to 3) or below (FIGS. 5 to 6).

FIG. 5 shows a schematic illustration of a side cross-sectional view of a semiconductor package 500.

The semiconductor package 500 may be similar to the semiconductor package 400. For example, the semiconductor package 500 may include one or more or all of the features of the semiconductor package 400.

The semiconductor die 101 may be electrically connected to the substrate 102 via a plurality of solder structures located at a first lateral surface 513 of the semiconductor die 101. The semiconductor package 500 may further include a heat spreader structure 512 thermally contacting the semiconductor die 101. For example, a first portion of the heat spreader structure 512 may be thermally connected to a second opposite lateral surface 514 of the semiconductor die 101 via a thermal interface material 515. The heat spreader structure 512 may be arranged on the second lateral surface 514 of the semiconductor die 101. At least part of the thermal interface material 515 may be located between the semiconductor die 101 and the heat spreader structure 512. A portion of the heat spreader structure 512 may be connected to the substrate 102 via the stiffener structure 103. The stiffener structure 103 may be a pillar structure supporting the heat spreader structure 512. For example, at least part of the stiffener structure 103 may be arranged between the heat spreader structure 512 and the substrate 102.

The semiconductor package 500 may further include a sealing material 516 arranged between (or e.g. directly connecting) the heat spreader structure 512 and the stiffener structure 103. The sealing material may include at least one material from the following group of materials: a polymer-based material, a silicon-based material, and an epoxy-based material. Optionally, a lateral width of some portions of the sealing material 516 may be less than 80% of the maximal lateral width of the stiffener structure 103, and a lateral width of other portions of the sealing material 516 may be equal to (or lie within +/−10%) of the maximal lateral width of the stiffener structure 103.

More details and aspects are mentioned in connection with the examples described above or below. The examples shown in FIG. 5 may comprise one or more optional additional features corresponding to one or more aspects mentioned in connection with the proposed concept or one or more examples described above (e.g. FIGS. 1A to 4) or below (FIG. 6).

FIG. 6 shows a flow chart of a method 600 for forming a semiconductor package.

The method 600 comprises arranging (in 610) at least one semiconductor die on a substrate.

The method 600 further comprises forming (in 620) a stiffener structure on the substrate. The stiffener structure is spaced at a distance from the at least one semiconductor die, and the stiffener structure comprises a molding compound material.

Due to the stiffener structure comprising the molding compound material, the stiffener structure may be modified more easily to reach a desired state compared to a stiffener structure including (or consisting of) other materials. For example, the stiffener structure may be flexibly arranged according to a desired design on desired regions of the substrate. It may be easier to avoid other components and/or form an over mold on other components of the semiconductor package to be formed, for example. Additionally, the overall size of the semiconductor package may be reduced, since a separation distance (e.g. a keep out zone KOZ) between the stiffener structure and the semiconductor die may not need to be as large as compared to metal stiffener structures or integrated heat spreader (IHS) lids.

The method 600 includes arranging the at least one semiconductor die on the substrate. The at least one semiconductor die may refer to one or more, or a plurality of semiconductor dies. In a single package process, it may be possible that the substrate already has a suitable dimension for a final single semiconductor package to be formed by method 600. In the single package process, only the semiconductor dies (e.g. one or more semiconductor dies) to be implemented in the single semiconductor package are attached to the substrate.

In a multiple package process, process 610 may be a batch (or parallel process) for arranging a plurality of semiconductor dies on the substrate. The plurality of semiconductor dies may be the semiconductor dies of a plurality of semiconductor packages to be formed by method 600.

The method may include attaching (e.g. soldering) each semiconductor die to the substrate by a c4 (e.g. flip chip) connection, for example. Thus, the semiconductor die may be joined or attached to the substrate via solder bumps arranged at a first lateral surface of the semiconductor die, for example.

After attaching the at least one semiconductor die to the substrate, the method 600 may include dispensing an underfill material between the at least one semiconductor die and the substrate so that the underfill material is arranged in (or fills) the gaps between the solder bumps of the plurality of solder bumps.

The method 600 may further include forming the stiffener structure on the substrate by dispensing the molding compound material onto the substrate to form the stiffener structure. The molding compound material may be dispensed by injection molding or compression molding using a mold chase design.

The stiffener structure may be formed on the substrate before or after arranging the at least one semiconductor die on the substrate. The molding compound material may be dispensed so that the stiffener structure is spaced at a distance (apart) from the at least one semiconductor die.

In a multiple package process, the method may include forming a plurality of stiffener structures at a plurality of regions on the substrate so that a plurality of stiffener structures are arranged on the substrate. Each stiffener structure may be spaced apart from each of the plurality of semiconductor dies arranged on the substrate. For example, a (or each) ring-shaped stiffener structure may be arranged laterally around a (or each) semiconductor die. Optionally or alternatively, each semiconductor die may be arranged between two L-shaped stiffener structures.

The method 600 may optionally further include arranging (e.g. attaching) at least one die side component (DSC) on the substrate structure at a distance from the at least one semiconductor die. The DSCs may be formed before or after forming the stiffener structure. Optionally, each DSC may be located between a stiffener structure and a semiconductor die. If the DSCs are formed before forming the stiffener structure, the stiffener structure may be formed so that the stiffener structure covers at least part of (or all of) the DSCs. Optionally, the stiffener structure may cover some DSCs (e.g. at least one) arranged on the substrate structure, and some other DSCs arranged on the substrate structure may be may be free from (e.g. not covered) by the stiffener structure.

The method 600 may further include arranging at least one heat spreader structure so that a heat spreader structure thermal contacts a semiconductor die at a (second) lateral surface of the semiconductor die. In a single package process, one heat spreader structure may thermally contact the second lateral surfaces of all the semiconductor dies to be implemented in the single semiconductor package to be formed. Alternatively, each semiconductor die of the single semiconductor package may be thermally connected to its own heat spreader structure.

In a multiple package process, a plurality of heat spreader structures may be arranged on the semiconductor dies so that at least one semiconductor die of each semiconductor package to be formed is thermally connected to a heat spreader structure.

The method 600 may further include forming a sealing material on the at least one stiffener structure before or after arranging the die side components on the substrate, but before arranging the heat spreader structure. The method 600 may include attaching (connecting) the heat spreader structure to the stiffener structure after forming the stiffener structure. The heat spreader structure may be connected to (or adhered to, or attached to) the stiffener structure via (or through or by) the sealing material. The stiffener structure may be a pillar structure supporting the heat spreader structure The method 600 may further include separating (e.g. dicing) through at least the substrate (and/or the stiffener structures) to generate a plurality of individual semiconductor packages. Each individual semiconductor package may include at least one semiconductor die and stiffener structure spaced laterally apart at a distance from the semiconductor die. Additionally or optionally, each individual semiconductor package may include at least one heat spreader structure thermally contacting the semiconductor die and/or at least one die side component. The at least one die side component may be at least partially covered or encapsulated by the stiffener structure.

The method 600 may further include connecting the substrate of the semiconductor package to a printed circuit board without forming an encapsulation material on the at least one semiconductor die before connecting substrate to the printed circuit board. The substrate of the semiconductor package may be attached to the printed circuit board via soldering, for example.

More details and aspects are mentioned in connection with the examples described above or below. The examples shown in FIG. 6 may comprise one or more optional additional features corresponding to one or more aspects mentioned in connection with the proposed concept or one or more examples described above (e.g. FIGS. 1A to 5) or below.

Various examples relate to using molded epoxy to form a discreet (stand-alone) on-stiffener structure to control package warpage.

The aspects and features (e.g. the semiconductor die, the substrate, the stiffener structure, the die side components, the sealing material and the heat spreader structure) mentioned and described together with one or more of the previously detailed examples and figures, may as well be combined with one or more of the other examples in order to replace a like feature of the other example or in order to additionally introduce the feature to the other example.

There may be a demand to provide concepts for semiconductor packages with reduced warping.

In the following, examples pertain to further examples.

Example 1 is a semiconductor package, comprising: a semiconductor die arranged on a substrate; and a stiffener structure arranged on the substrate, wherein the stiffener structure is spaced at a distance from the semiconductor die, and wherein the stiffener structure comprises a molding compound material.

In example 2, the subject matter of example 1 can optionally include the stiffener structure being an electrically insulating stiffener structure.

In example 3, the subject matter of example 1 or 2 can optionally include the stiffener structure covering less than 70% of a total area of a surface of the substrate on which the semiconductor die is disposed.

In example 4, the subject matter of any of examples 1 to 3 can optionally include a maximal width of the stiffener structure being smaller than a maximal length of the semiconductor die.

In example 5, the subject matter of any of examples 1 to 4 can optionally include a maximal thickness of the stiffener structure being less than 3 times a maximal thickness of the semiconductor die.

In example 6, the subject matter of any of examples 1 to 5 can optionally include the stiffener structure being formed directly on the substrate.

In example 7, the subject matter of any of examples 1 to 6 can optionally include the distance between the semiconductor die and the stiffener structure at a surface of the substrate being less than 80% of a maximal length of the semiconductor die.

In example 8, the subject matter of any of examples 1 to 7 can optionally include the distance between the semiconductor die and the stiffener structure at a surface of the substrate being larger than 10 µm.

In example 9, the subject matter of any of examples 1 to 8 can optionally include the distance between the semiconductor die and the stiffener structure at a surface of the substrate being smaller than 20 mm.

In example 10, the subject matter of any of examples 1 to 9 can optionally include a young's modulus of the stiffener structure being larger than 10 GPa.

In example 11, the subject matter of any of examples 1 to 10 can optionally include the molding compound comprising at least one material from the following group of materials: an epoxy resin material, a mold release material, a filler material and a thermoset material.

In example 12, the subject matter of any of examples 1 to 11 can optionally include a first portion of the stiffener structure being arranged at a distance from a first edge of the semiconductor die, and a second portion of the stiffener structure being arranged at a distance from a second opposite edge of the semiconductor die.

In example 13, the subject matter of any of examples 1 to 12 can optionally include the stiffener structure being arranged around the semiconductor die at a distance from edges of the semiconductor die.

In example 14, the subject matter of any of examples 1 to 13 can optionally include an air gap between the semiconductor die and the stiffener structure.

In example 15, the subject matter of any of examples 1 to 14 can optionally include the semiconductor die being free from the stiffener structure.

In example 16, the subject matter of any of examples 1 to 15 can optionally include the stiffener structure being configured to reduce a warpage of the semiconductor package.

In example 17, the subject matter of any of examples 1 to 16 can optionally further include at least one die side component arranged on the substrate, wherein the stiffener structure covers at least part of the at least one die side component.

In example 18, the subject matter of any of examples 1 to 17 can optionally include the stiffener structure encapsulating the at least one die side component.

In example 19, the subject matter of any of examples 1 to 18 can optionally include at least one die side component located between the stiffener structure and the semiconductor die.

In example 20, the subject matter of example 19 can optionally include the die side component is free from the stiffener structure.

In example 21, the subject matter of any of examples 1 to 20 can optionally further include a heat spreader structure thermally contacting the semiconductor die, wherein the stiffener structure is arranged between the heat spreader structure and the substrate.

In example 22, the subject matter of example 21 can optionally include the heat spreader structure being connected to a surface of the semiconductor die via a thermal interface material.

In example 23, the subject matter of example 21 or 22 can optionally further include a sealing material arranged between the heat spreader structure and the stiffener structure.

In example 24, the subject matter of example 23 can optionally include a sealing material comprising at least one material from the following group of materials: a polymer-based material, a silicon-based material, a solder-based material, a metal-based material and an epoxy-based material.

In example 25, the subject matter of example 23 or 24 can optionally include a maximal width of the sealing material being less than 80% of a maximal width of the stiffener structure.

In example 26, the subject matter of any of examples 1 to 25 can optionally include the semiconductor die being electrically connected to the substrate via a plurality of solder structures.

In example 27, the subject matter of any of examples 1 to 26 can optionally further include an underfill material formed between the semiconductor die and the substrate.

In example 28, the subject matter of any of examples 1 to 27 can optionally include the substrate comprising a solder grid array arranged on an opposite surface of the substrate from the semiconductor die.

In example 29, the subject matter of any of examples 1 to 28 can optionally include the substrate comprising a ceramic material or a laminate material.

In example 30, the subject matter of any of examples 1 to 29 can optionally include the semiconductor package being a bare die semiconductor package.

In example 31, the subject matter of example 30 can optionally include the stiffener structure and the semiconductor die being free from encapsulation material.

Example 32 is a method for forming a semiconductor package. The method comprises arranging at least one semiconductor die on a substrate; and forming a stiffener structure on the substrate, wherein the stiffener structure is spaced at a distance from the at least one semiconductor die, and wherein the stiffener structure comprises a molding compound material.

In example 33, the subject matter of example 32 can optionally include that forming the stiffener structure on the substrate comprises dispensing the molding compound material onto the substrate to form the stiffener structure.

In example 34, the subject matter of example 32 or 33 can optionally include that the molding compound material is dispensed by at least one dispensing process from the following group of dispensing processing: an injection molding process, a transfer molding process, and a compression molding process.

In example 35, the subject matter of any of examples 32 to 34 can optionally include that the stiffener structure is formed on the substrate before arranging the at least one semiconductor die on the substrate.

In example 36, the subject matter of any of examples 32 to 35 can optionally further include arranging at least one die side component on the substrate structure at a distance from the at least one semiconductor die, and forming the stiffener structure so that the stiffener structure covers at least part of the at least one die side component.

In example 37, the subject matter of any of examples 32 to 36 can optionally further include forming a sealing material on the stiffener structure; and attaching a heat spreader structure to the stiffener structure via the sealing material.

In example 38, the subject matter of any of examples 32 to 37 can optionally further include connecting the substrate to a printed circuit board without forming an encapsulation material on the at least one semiconductor die before connecting substrate to the printed circuit board.

In example 39, the subject matter of any of examples 32 to 38 can optionally include arranging a plurality of semiconductor dies on the substrate; forming a plurality of stiffener structures at a plurality of regions on the substrate; and separating through at least the substrate to generate a plurality of individual semiconductor packages, wherein each semiconductor package comprises at least one semiconductor die and at least one stiffener structure spaced at a distance from the semiconductor die.

Example 40 is a machine readable storage medium including program code, which when executed, causes a machine to perform the method of any of claims 32 to 39.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A semiconductor package, comprising:
a semiconductor die arranged on a substrate; and
a stiffener structure arranged directly on the substrate, wherein the stiffener structure is spaced at a distance from the semiconductor die, and wherein the stiffener structure comprises a molding compound material.

2. The semiconductor package according to claim 1, wherein the stiffener structure is an electrically insulating stiffener structure.

3. The semiconductor package according to claim 1, wherein the stiffener structure covers less than 70% of a total area of a surface of the substrate on which the semiconductor die is disposed.

4. The semiconductor package according to claim 1, wherein a maximal width of the stiffener structure is smaller than a maximal length of the semiconductor die.

5. The semiconductor package according to claim 1, wherein a maximal thickness of the stiffener structure is less than 3 times a maximal thickness of the semiconductor die.

6. The semiconductor package according to claim 1, wherein the distance between the semiconductor die and the stiffener structure at a surface of the substrate is between 5% and 95% of a maximal length of the semiconductor die.

7. The semiconductor package according to claim 1, wherein the distance between the semiconductor die and the stiffener structure at a surface of the substrate is larger than 10 um.

8. The semiconductor package according to claim 1, wherein the distance between the semiconductor die and the stiffener structure at a surface of the substrate is smaller than 20 mm.

9. The semiconductor package according to claim 1, wherein a young's modulus of the stiffener structure is larger than 10 GPa.

10. The semiconductor package according to claim 1, wherein a first portion of the stiffener structure is arranged at a distance from a first edge of the semiconductor die, and wherein a second portion of the stiffener structure is arranged at a distance from a second opposite edge of the semiconductor die.

11. The semiconductor package according to claim 1, wherein the semiconductor die is free from the stiffener structure.

12. The semiconductor package according to claim 1, further comprising at least one die side component arranged on the substrate, wherein the stiffener structure covers at least part of the at least one die side component.

13. The semiconductor package according to claim 12, wherein the stiffener structure encapsulates the at least one die side component.

14. The semiconductor package according to claim 1, further comprising a heat spreader structure thermally contacting the semiconductor die, wherein the stiffener structure is arranged between the heat spreader structure and the substrate.

15. The semiconductor package according to claim 1, wherein the semiconductor die is electrically connected to the substrate via a plurality of solder structures.

16. The semiconductor package according to claim 1, wherein the substrate comprises a solder grid array arranged on an opposite surface of the substrate from the semiconductor die.

17. The semiconductor package according to claim 1, wherein the semiconductor package is a bare die semiconductor package.

18. The semiconductor package according to claim 17, wherein the stiffener structure and the semiconductor die are free from encapsulation material.

19. A method for forming a semiconductor package, the method comprising
arranging at least one semiconductor die on a substrate; and
forming a stiffener structure directly on the substrate, wherein the stiffener structure is spaced at a distance from the at least one semiconductor die, and wherein the stiffener structure comprises a molding compound material.

20. The method according to claim 19, wherein forming the stiffener structure on the substrate comprises dispensing the molding compound material onto the substrate to form the stiffener structure.

21. The method according to claim 19, wherein the stiffener structure is formed on the substrate before arranging the at least one semiconductor die on the substrate.

22. The method according to claim 19, further comprising arranging at least one die side component on the substrate structure at a distance from the at least one semiconductor die, and forming the stiffener structure so that the stiffener structure covers at least part of the at least one die side component.

23. The method according to claim 19, further comprising
forming a sealing material on the stiffener structure; and
attaching a heat spreader structure to the stiffener structure via the sealing material.

24. The method according to claim 19, further comprising connecting the substrate to a printed circuit board without forming an encapsulation material on the at least one semiconductor die before connecting substrate to the printed circuit board.

* * * * *